United States Patent
Chun et al.

(10) Patent No.: US 7,250,346 B2
(45) Date of Patent: Jul. 31, 2007

(54) DUAL GATE OXIDE STRUCTURE IN SEMICONDUCTOR DEVICE AND METHOD THEREOF

(75) Inventors: Jong-Sik Chun, Gyeonggi-do (KR); Hyun-Ho Jo, Seoul (KR); Byung-Hong Chung, Seoul (KR)

(73) Assignee: Samsung Electronics Col., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 10/876,277

(22) Filed: Jun. 23, 2004

(65) Prior Publication Data

US 2005/0085042 A1    Apr. 21, 2005

(30) Foreign Application Priority Data

Jun. 23, 2003    (KR) .................. 10-2003-0040714

(51) Int. Cl.
*H01L 21/336* (2006.01)

(52) U.S. Cl. .............. 438/283; 438/221; 438/196; 438/296

(58) Field of Classification Search .......... 438/142, 438/195–197, 199, 216–217, 221, 275, 283, 438/588, 296–297, 424
See application file for complete search history.

(56) References Cited

U.S. PATENT DOCUMENTS

| | | | |
|---|---|---|---|
| 5,683,945 A | 11/1997 | Penner et al. | |
| 6,133,093 A | 10/2000 | Prinz et al. | |
| 6,277,682 B1* | 8/2001 | Misium | 438/199 |
| 6,468,099 B2* | 10/2002 | Kim | 439/199 |
| 6,482,716 B1 | 11/2002 | Wohlfahrt | |
| 6,566,207 B2* | 5/2003 | Park | 438/296 |
| 6,677,639 B2* | 1/2004 | Lee et al. | 257/314 |
| 6,683,364 B2* | 1/2004 | Oh et al. | 257/510 |

\* cited by examiner

*Primary Examiner*—M. Wilczewski
*Assistant Examiner*—Thanh Y. Tran
(74) *Attorney, Agent, or Firm*—Marger Johnson & McCollom, P.C.

(57) ABSTRACT

In the method of manufacturing a dual gate oxide layer of a semiconductor device, which has first and second active regions operating at mutually different voltages on a semiconductor substrate, the first and second active regions having a device isolation layer of STI (Shallow Trench Isolation) structure; the method of manufacturing the dual gate insulation layer includes, forming the device isolation layer so that an uppermost part thereof is positioned lower than an upper surface of the first and second active regions, before forming a gate insulation layer corresponding to each of the first and second active regions. Whereby, it is be effective till a portion of trench sidewall utilized as the active region, to increase a cell current of the active region and to prevent a stringer caused by a stepped coverage between the active region and a field region and a dent caused on a boundary face between the active region and the field region.

9 Claims, 7 Drawing Sheets

DUAL GATE OXIDE STRUCTURE IN SEMICONDUCTOR DEVICE AND METHOD THEREOF

CROSS-REFERENCE TO RELATED APPLICATIONS

This application claims priority from Korean Patent Application 2003-0040714, filed Jun. 23, 2003, the contents of which are incorporated herein by reference.

FIELD OF THE INVENTION

This disclosure relates to a semiconductor device, and more particularly, to a method of forming a dual gate oxide having oxide layers based on different thickness in different voltage regions.

PRIOR ART OF THE INVENTION

In a semiconductor memory device such as an SRAM etc., an operating voltage of a transistor constituting a memory cell and an operating voltage of transistor positioned within a peripheral logic circuit to access data of the memory cell are typically different from each other, thus a thickness of gate insulation layers, e.g., oxide layers, are also different. Further, in the field of power devices such as LDI (LCD Driver IC) products, a low voltage operation for driving a logic circuit and a high voltage operation for driving an LCD are all necessary in a driving device, thus a gate oxide layer should have a dual gate structure and an employment for a shallow trench isolation (STI) structure based on a reduction of line width, which is also tending to be used.

However, in applying a dual gate oxide to the STI structure using manufacturing processes of the prior art, an uppermost part of the device isolation layer is positioned higher than an upper surface of active region, which causes a stepped coverage therebetween. If the stepped coverage occurs, a portion of a trench sidewall cannot be used as the active region, and a stringer occurs due to the stepped coverage between the active region and the field region. This also causes a relatively severe dent on a boundary face between the active region and the field region owing to a wet etching rate difference between materials of a field oxide layer formed in the STI and a thermal oxide layer formed in the active region.

The dual gate oxide manufacturing process of the prior art will be described referring to FIGS. 1a through 1f in order to thoroughly understand the causes of the above-mentioned phenomena.

Referring to FIGS. 1a to 1f illustrating a process sequence, a method of forming dual gate oxide according to the prior art will be described in detail. Herewith, the process will be described with six steps for the explanatory convenience. In the drawings, reference character I indicates a low voltage (LV) region of a substrate as a first active region on which a thinned gate oxide will be formed, and reference character II designates a high voltage (HV) region as a second active region on which a thick gate oxide will be formed.

Figure 1A:
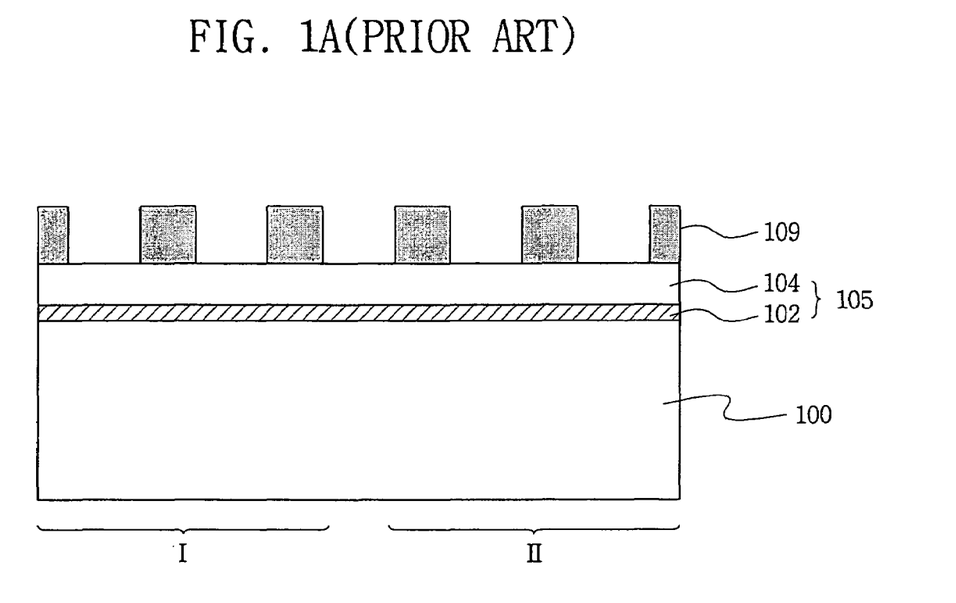
FIGS. 1a to 1f are diagrams illustrating a sequential process in a dual gate oxide forming method according to the prior art.

In a first step, as shown in FIG. 1a, a pad oxide layer 102 and a nitride layer 104 are accumulated sequentially on a semiconductor substrate 100 to form a layer 105. Next, on the nitride layer 104, a photoresist pattern 109 is formed which will expose a portion where a trench for defining the first active region I and the second active region II will be formed, and a portion where a trench for a device isolation of each active region will be formed.

Figure 1B:
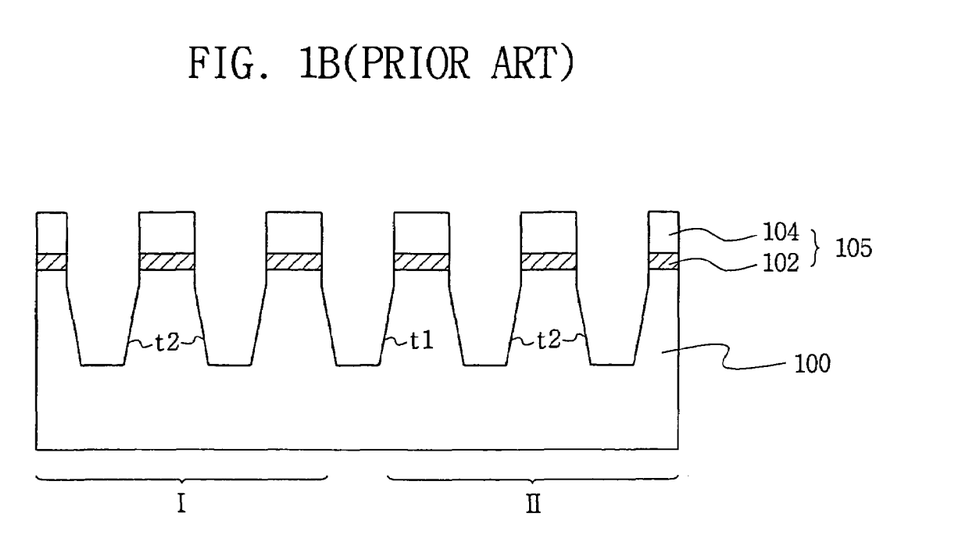

In a second step, as shown in FIG. 1b, the nitride layer 104, the pad oxide layer 102 and the semiconductor substrate 100 are etched sequentially by using the photoresist pattern 109 as an etch mask, to form a trench t1 for defining the first active region I and the second active region II on the semiconductor substrate 100, and to form a trench t2 for isolating devices on each active region. Then, the remaining photoresist pattern 109 is removed through an ashing process.

Figure 1C:
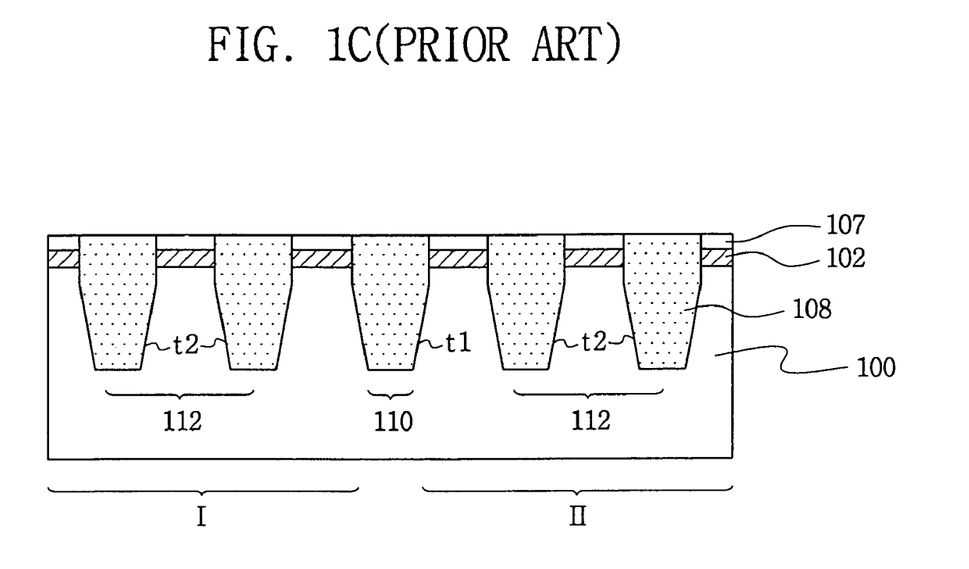

In a third step, as shown in FIG. 1c, a field oxide layer 108 is formed of a USG (Undoped Silicate Glass) or HDP (High Density Plasma) material, to completely fill up the trenches t1, t2. Further, a flattening process such as a CMP (Chemical Mechanical Polishing) etc. for the field oxide layer 108 and the nitride layer 104 is performed so that a nitride layer pattern 107 partially remains on the first and second active regions I, II, to thus form first and second device isolation layers 110, 112 for filling the trenches t1, t2. The first device isolation layer 110 is defined as a layer to isolate between the first and second active regions and the field region, and the second device isolation layer 112 is defined as a layer to isolate devices of each active region.

Figure 1D:
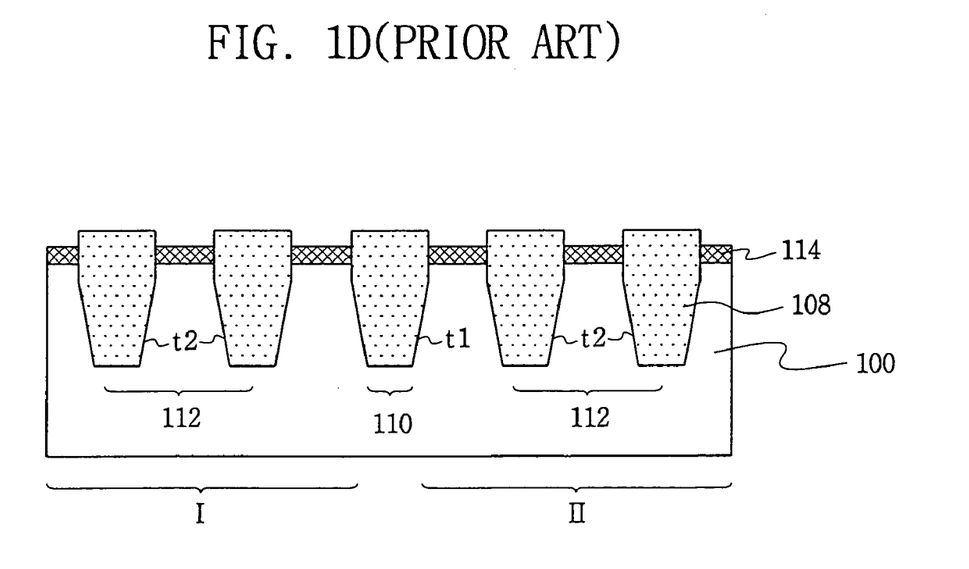

In a fourth step, as shown in FIG. 1d, the remaining nitride layer 107 is removed by a wet etching using $H_3PO_4$, and the pad oxide layer 102 is removed by a wet etching using a diluted HF, to thus expose the surface of the first and second active regions I, II. Subsequently, a first thermal oxide layer 114 of 300 Å for high voltage use is formed on the surface exposed portion of the first and second active regions I, II.

Figure 1E:
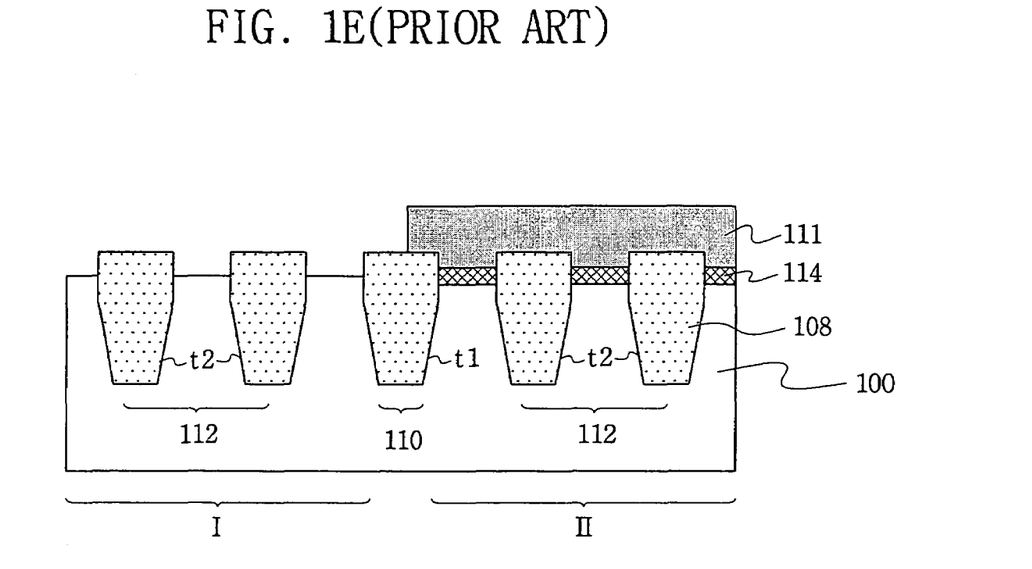

In a fifth step, as shown in FIG. 1e, a photoresist pattern 111 for exposing the first active region I and a portion of the first device isolation layer 110 is formed, and then, the first thermal oxide layer is etched by using the photoresist pattern 111 as an etch mask, to selectively leave the first thermal oxide layer 114 only on the second active region II.

Figure 1F:
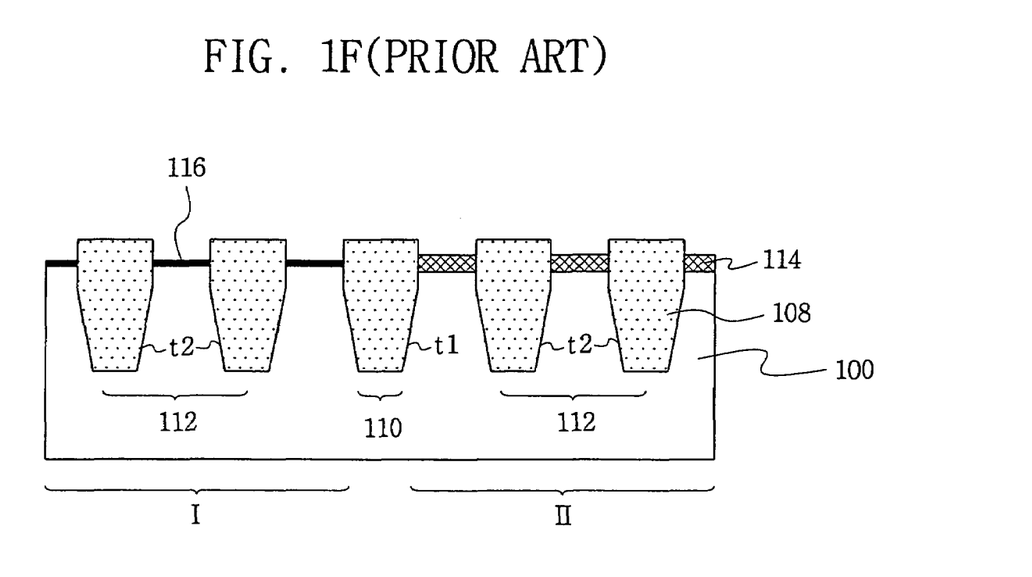

In a sixth step, as shown in FIG. 1f, the photoresist pattern 111 is removed by an ashing process, and a second thermal oxide layer 116 of 40 Å for use of low voltage is formed on the first active region I, to thus complete a dual gate oxide layer process. Of course, in forming the second thermal oxide layer 116, the first thermal oxide layer 114 also grows an insignificant amount.

As the result of that process, the thinned gate oxide layer 116 of second thermal oxide material for use of a low voltage is formed on the first active region I, and the thick gate oxide layer 114 of first thermal oxide material for use of a high voltage is formed on the second active region II.

Even though this structure of dual gate oxide layer based on the prior art can increase an integration of device, a size of active region has a fixed structure, and an upper part of STI is positioned higher than an upper part of the active region, causing a stepped structure, thus there are many problems as follows.

First, since the upper part of STI is positioned higher than an upper part of the active region, i.e., the stepped structure, a trench sidewall portion can not be used as the active region, which causes the active region to have a fixed size.

Also, in a subsequent gate etching process, a stringer based on the stepped coverage between an active region and a field region is caused.

Further, the STI is formed of field oxide material such as USG or HDP etc., and the gate oxide layer is formed of thermal oxide material, thus in using an etching process to form the dual gate oxide layer, a severe dent is caused on a boundary face between the active region and the field region owing to a wet etching rate difference between the field oxide layer and the thermal oxide layer.

Embodiments of the invention address these and other limitations of the prior art.

SUMMARY OF THE PRESENT INVENTION

Example embodiments of the present invention provide a dual gate oxide structure in a semiconductor device and a method of forming the structure, which is capable of extending an area of active region by utilizing a trench sidewall portion of the device isolation layer as the active region. Herewith, a cell current of the active region can increase to enhance a characteristic of the device. In addition, a stringer caused by a stepped coverage between an active region and a field region can be prevented, and it can prevent a dent caused on a boundary face between the active region and the field region owing to a wet etching rate difference between field oxide material formed on a STI and thermal oxide material formed on the active region.

According to an exemplary embodiment of the present invention, a method of forming a dual gate oxide layer includes, sequentially accumulating a first insulation layer and a second insulation layer on a semiconductor substrate; sequentially etching the second insulation layer, the first insulation layer and a portion of the semiconductor substrate, and forming a trench for defining first and second active regions on the semiconductor substrate; filling up the trench with a field oxide layer, and then, flattening the field oxide layer and the second insulation layer so that the second insulation layer accumulated on the first insulation layer remains by a determined thickness, to thus form a device isolation layer; removing the remaining second insulation layer, and etching the first insulation layer and the device isolation layer in such a way that an uppermost part of the device isolation layer is positioned below an upper surface of the first and second active regions; forming a first thermal oxide layer for use of a gate oxide layer on the first and second active regions; and removing the first thermal oxide layer provided with the first active region, and then, forming a second thermal oxide layer for use of a gate oxide layer on the first active region, the second thermal oxide layer having a thickness thinner than the first thermal oxide layer.

The device isolation layer is formed so that an uppermost part of the device isolation layer is positioned below by a determined thickness from an upper surface of the first and second active regions.

BRIEF DESCRIPTION OF THE DRAWINGS

The above and other features of exemplary embodiment of the present invention will become readily apparent from the description of the exemplary embodiments that follows, with reference to the attached drawings.

DETAILED DESCRIPTION OF EXEMPLARY EMBODIMENTS OF THE INVENTION

The present invention and example embodiments, thereof, are more fully described below with reference to FIGS. 2a through 2h. This present invention may, however, be embodied in many different forms and should not be construed as being limited to the example embodiments set forth herein. Rather, these example embodiments are provided so that this disclosure is thorough and complete, and conveys the concept of the present invention to those skilled in the art.

FIGS. 2a to 2h are diagrams illustrating a sequential process of dual gate oxide forming method according to an exemplary embodiment of the present invention. The process classified into eight steps for convenience will be described as follows.

Reference character I indicates a low voltage (LV) region as a first active region on which a thinned gate oxide layer will be formed, and reference character II designates a high voltage (HV) region as a second active region on which a thick gate oxide layer will be formed. The HV region indicates a region designed to have an internal voltage of approximately 3.3V through 50V in an operating voltage.

Figure 2A:
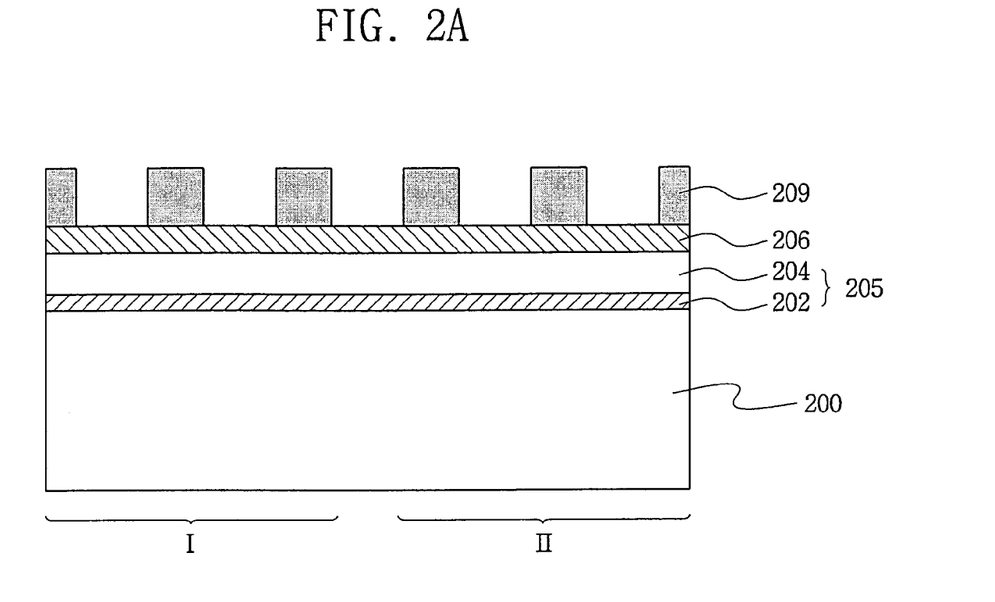
FIGS. 2a to 2h are diagrams illustrating a sequential process in a dual gate oxide forming method according to an exemplary embodiment of the present invention.

In a first step, as shown in FIG. 2a, a first insulation layer 202 and a second insulation layer 204 are sequentially accumulated (205) on a semiconductor substrate 200. Next, on the second insulation layer 204, a photoresist pattern 209 is formed for exposing a portion where a trench for defining a first active region I and a second active region II will be formed, and a portion where a trench for a device isolation will be formed on each active region. Further, an oxide layer 206 of MTO (Medium Temperature Oxide) material formed at a temperature of approximately 700° C. through 800° C. is additionally formed on the second insulation layer 204, and the photoresist pattern 209 is desirably formed on this MTO 206.

The first insulation layer 202 can be formed of oxide material through a thermal oxide method, and the second insulation layer 204 can be formed through LPCVD (Low Pressure Chemical Vapor Deposition), for example.

Further, in performing a flattening process such as a chemical mechanical polishing (CMP) etc., the second insulation layer 204 can be formed of SiN or SiON material having a relatively low removal rate as compared with the field oxide layer.

Figure 2B:
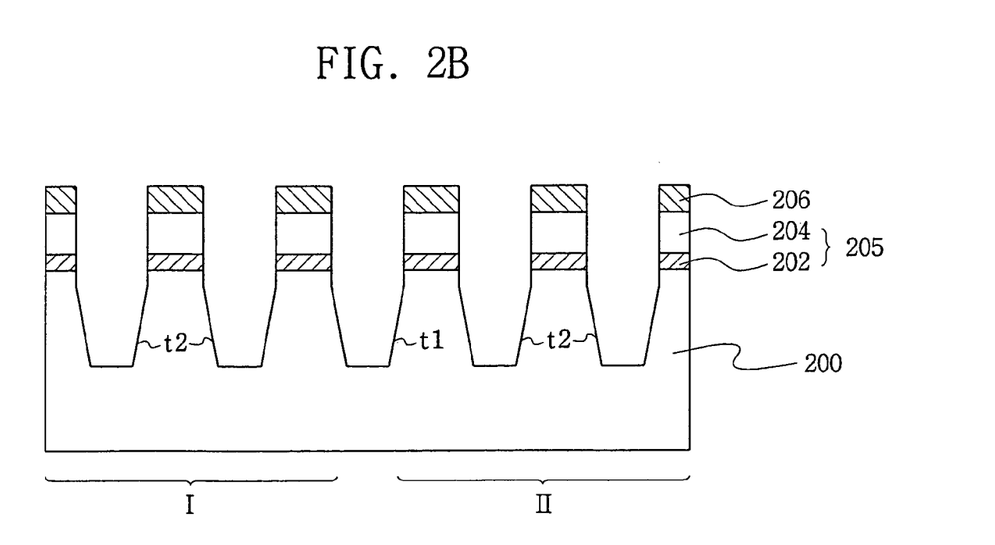

In a second step, as shown in FIG. 2b, the MTO 206, the second insulation layer 204, the first insulation layer 202 and the semiconductor substrate 200 are sequentially etched by using the photoresist pattern 209 as an etch mask, to form a trench t1 for defining the first active region I and the second active region II on the semiconductor substrate 200 and a trench t2 for isolating devices on each active region. Then, a remaining photoresist pattern 209 is removed by, for instance, an ashing process.

Figure 2C:
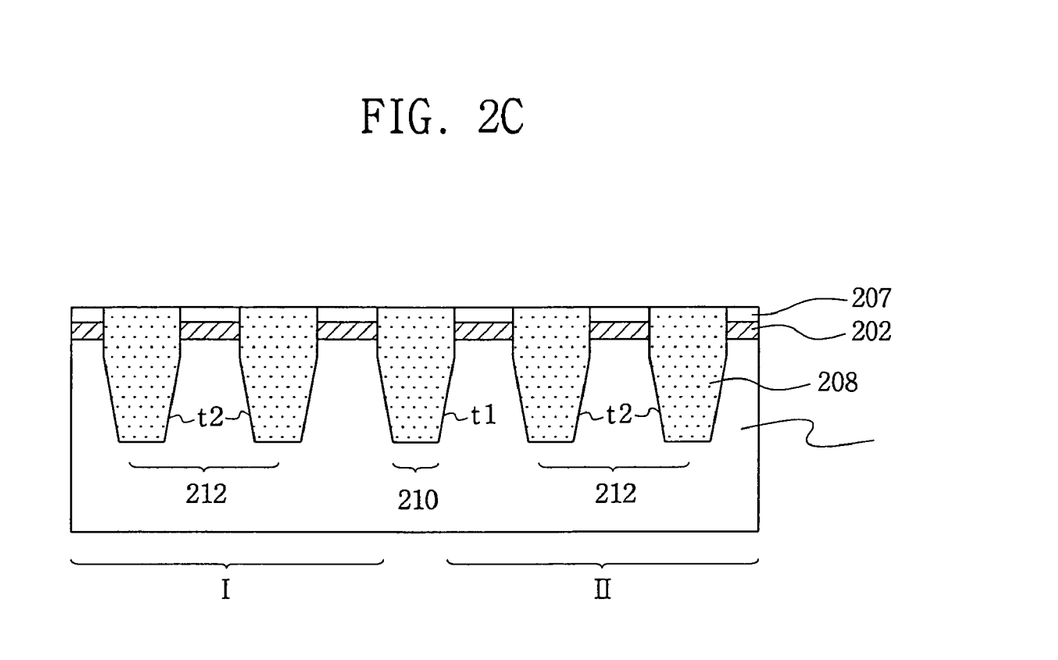

In a third step, as shown in FIG. 2c, the trenches t1, t2 are filled with a field oxide layer 208, and then, the field oxide layer 208, the MTO 206 and the second insulation layer 204 are flattened through a flattening process such as the CMP etc. so that the second insulation layer 204 accumulated on the first insulation layer 202 remains (207) at a determined thickness. This thus forms a first device isolation layer 210 for defining the first active region I and the second active region II and a second device isolation layer 212 for isolating devices provided on each active region. The first device isolation layer 210 is defined to isolate the first and second active regions and the field region, and the second device isolation layer 212 is defined to isolate devices of each active region.

The field oxide layer 208 fills the trenches t1, t2 enough to sufficiently cover a surface of the semiconductor substrate. Further, the field oxide layer 208 may be formed of, for example, an oxide layer group such as SOG (Spin On Glass), USG (Undoped Silicate Glass), BPSG (Boron Phosphorus Silicate Glass), PSG (Phosphor Silicate Glass), PE-TEOS (Plasma Enhanced Tetra Ethyl Ortho Silicate) and flowable oxide material, or can be formed of a multilayer containing two or more from the oxide layer group. The oxide layer group can be formed through a CVD (chemical vapor deposition), a reflow system and a deposition using a high density plasma (HDP) equipment, for example. In performing the CMP, the second insulation layer 204 functions as a stop layer on which the polishing operation is ultimately stopped.

Figure 2D:
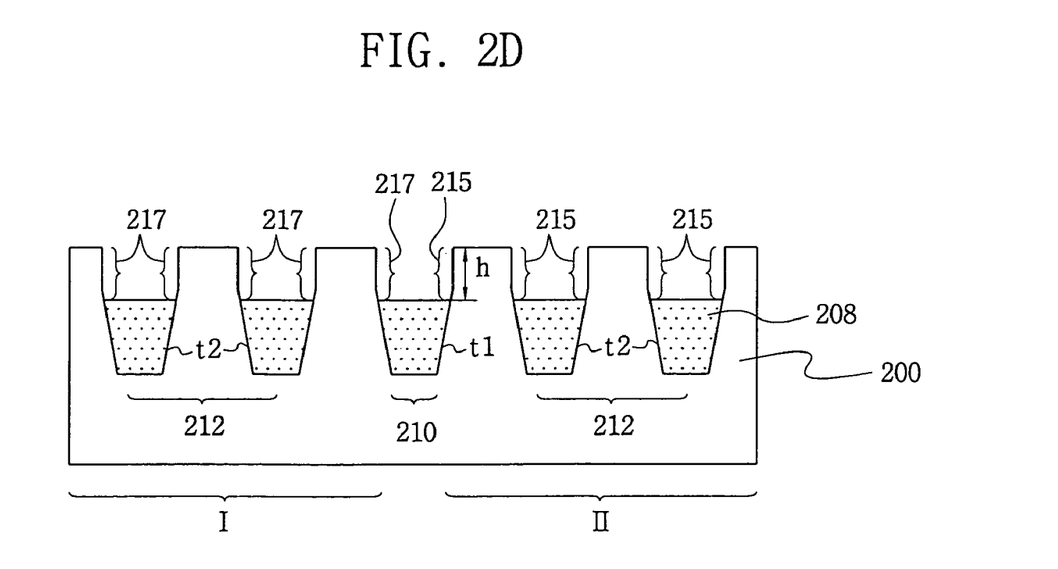

In a fourth step, as shown in FIG. 2d, the remaining second insulation layer 207 is removed by a wet etching using, for example, $H_3PO_4$.

Subsequently, the first insulation layer 202 and the device isolation layers 210, 212 together are etched so that an uppermost part of the first and second device isolation layers 210, 212 is positioned below an upper surface of the first and second active regions I, II with a difference of determined thickness (h), resulting in FIG. 2d illustrating that an upper surface of each active region I, II and sidewalls 215, 217 of less-filled trenches are exposed.

The first insulation layer 202 is formed of oxide material, and the field oxide layer 208 constituting the device isolation layers 210, 212 may also be formed of oxide material, thus the first insulation layer 202 and the device isolation layers 210, 212 together can be etched by controlling etching equipment. That is, the device isolation layers 210, 212 are made of the same material are etched at the same time when the first insulation layer 202 is etched. Thus the first insulation layer is removed and an upper part of the device isolation layer 210, 212 can be formed so as to be positioned below by a determined thickness (h) from an upper surface of the first and second active regions I, II. Therefore, a process of specifically removing the first insulation layer 202, which is required for the prior art, is unnecessary using embodiments of the invention.

Further, an uppermost part of the device isolation layer 210, 212 is positioned below by a determined thickness (h) an upper surface of the first and second active regions I, II, thus surfaces of less-filled trench sidewalls 215, 217 are exposed so that a gate oxide layer can be formed in the exposed portions in a subsequent process.

The determined thickness (h) may have a significant meaning in the present invention in that the top of the uppermost part of the device isolation layer 210, 212 is positioned below the upper surface of the first and second active regions I, II so as to increase an effective area of the active region by utilizing the surfaces 215, 217 of the less-filled trench sidewalls 215, 217 as the active region. Herewith, in considering possible defects in the device isolation, it is desirable to form the device isolation layer 210, 212 to be positioned below by about 200 Å through 300 Å from the upper surface of the first and second active regions I, II.

In the prior art there was the problem for the stepped coverage that a sidewall portion of trench can not be utilized as the active region because the uppermost end of the device isolation layer was positioned higher than an upper surface of the active region. However, in embodiments of the present invention, the end of uppermost part of the device isolation layer 210, 212 is positioned below the upper surface of the first and second active regions 1,11, thus the less-filled trench sidewalls 215, 217 can be used as the active region to increase an area and cell current of the active region. Further, as was described above, even in forming the device isolation layer so that the uppermost end of the device isolation layer 210, 212 is positioned below the upper surface of the first and second active regions I, II, the oxide layer of the first and second active regions I, II can be formed by a normal thickness on the less-filled trench sidewalls 215, 217 of the device isolation layer. In other words, the less-filled trench sidewalls 215, 217 can be utilized as the active region.

If the field region is positioned higher than the active region, as in the prior art, a poly stringer can be caused in a subsequent gate etching process, but in embodiments of the present invention, the stringer can be prevented since the field region is positioned below the active region.

It can also prevent a phenomenon that a severe dent is caused on a boundary face between the active region and the field region due to a wet etching rate difference between materials of the field oxide layer formed on the device isolation layer and of thermal oxide layer formed on the active region.

Figure 2E:
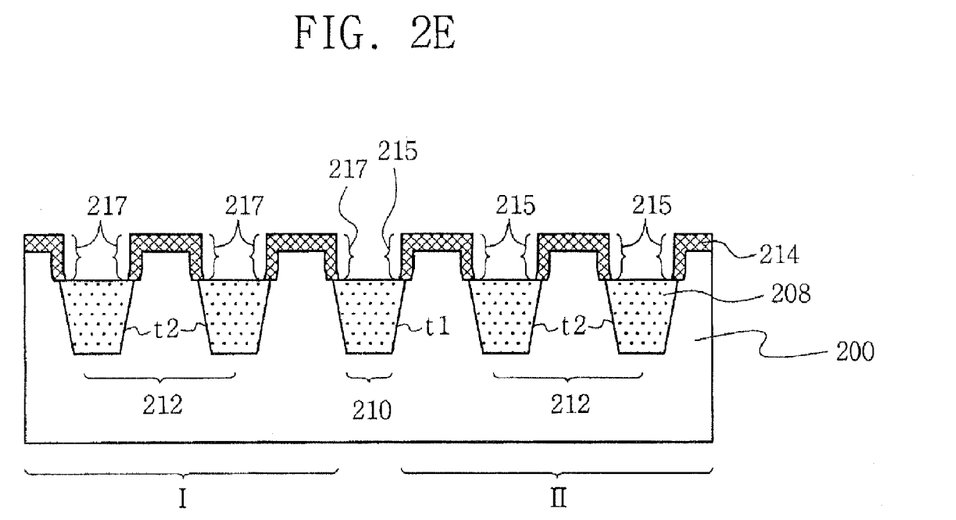

In a fifth step, as shown in FIG. 2e, a first thermal oxide layer 214 of about, for example, 400 through 450 Å for use in high voltage applications is formed on the exposed surface of the first and second active regions I, II. Thus, the first thermal oxide layer 214 is also formed on the exposed portion of the less-filled trench sidewalls 215, 217 by a normal thickness. That is, a first sidewall 215 of the less-filled trench can be utilized as the active region.

Figure 2F:
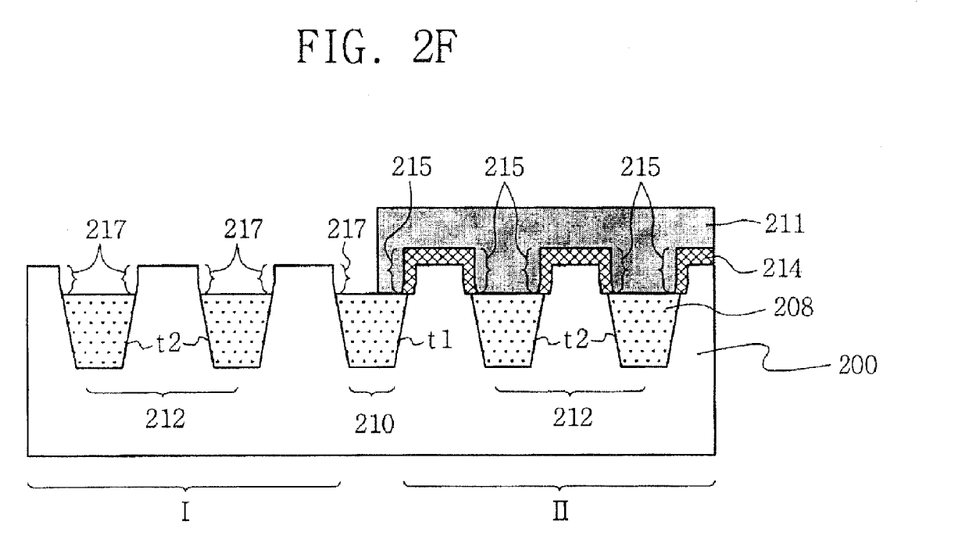

In a sixth step, as shown in FIG. 2f, a photoresist pattern 211 for exposing the first active region I and a portion of the first device isolation layer 210 is formed, and then, the first thermal oxide layer is etched by using the photoresist pattern 211 as an etch mask, to selectively leave the first thermal oxide layer 214 only on the second active region II.

Figure 2G:
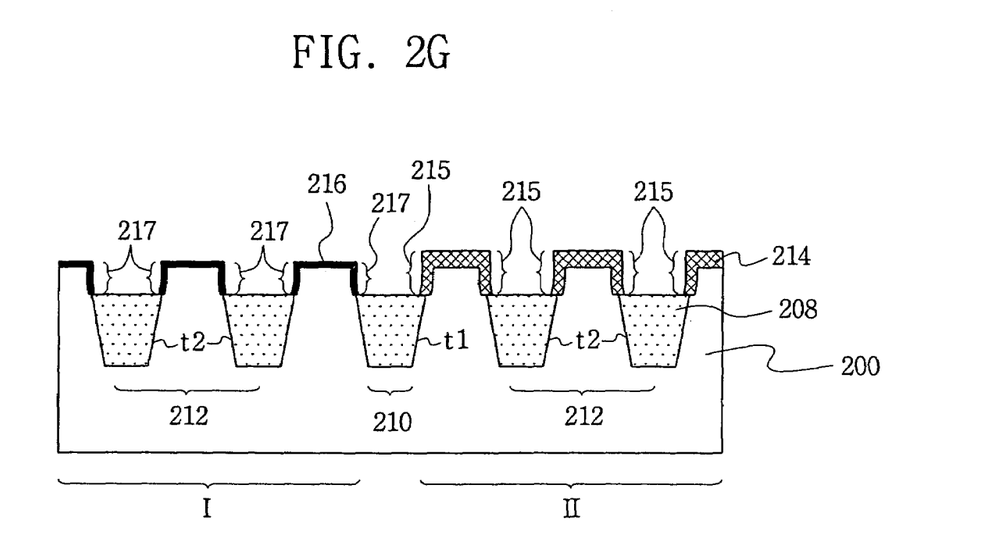

In a seventh step, as shown in FIG. 2g, the photoresist pattern 211 is removed by an ashing process, and a second thermal oxide layer 216 of 30 through 50 Å for low voltage uses is formed on the first active region I, to thus complete the dual gate oxide layer process. It goes without saying that, the second thermal oxide layer 216 is formed by a normal thickness on an exposed portion of the second sidewall 217 provided with the less-filled trench of the first active region, therefore, the second sidewall 217 of the less-filled trench can be used as the active region. In forming the second thermal oxide layer 216, the first thermal oxide layer 214 grows insignificantly.

As the result of these processes, an uppermost end of the device isolation layer 210, 212 is positioned below an upper surface of the first and second active regions I, II, and the thinned gate oxide layer 216 of the second thermal oxide material for use of low voltage is formed on an upper surface of the first active region I and on the second sidewall 217 of less-filled trench, and the thick gate oxide layer 214 of the first thermal oxide material for high voltage use is formed on an upper surface of the second active region II and on the first sidewall 215 of the less-filled trench.

According to this exemplary embodiment of the present invention, a top of the device isolation layer is positioned below an upper surface of the active region, thus the less-filled trench sidewall can be used as the active region to increase an area and cell current of the active region. In addition, stringers caused by a stepped coverage between the active region and field region can be prevented. Further severe dents found in the prior art that are caused on a boundary between the active region and the field region, owing to a wet etching rate difference between materials of the field oxide layer formed on the STI and of the thermal oxide layer formed on the active region of the prior art can also be prevented.

Figure 2H:
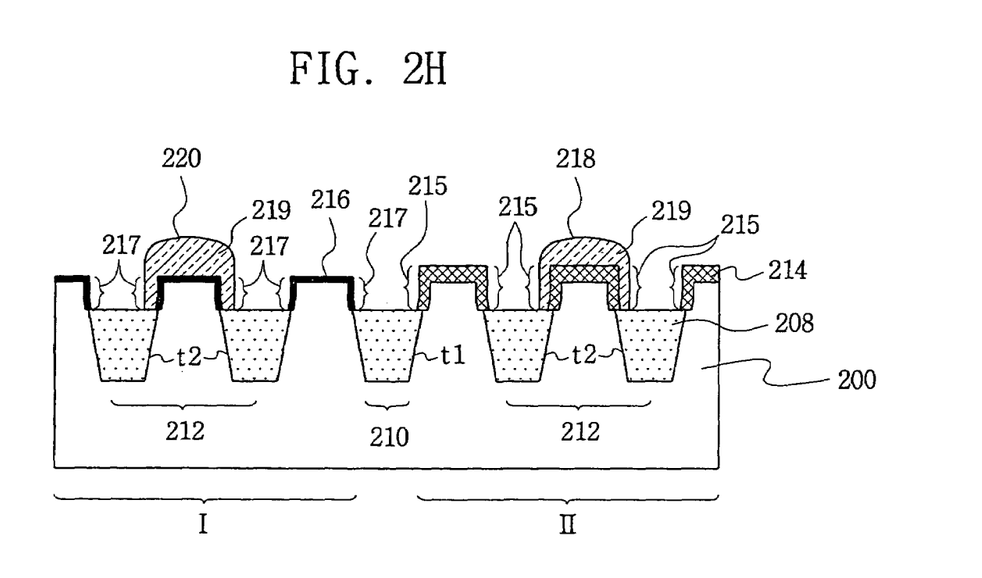

In an eighth step, as shown in FIG. 2h, a polysilicon layer 219 is accumulated on the gate oxide layer that is formed on an upper surface of respective active regions I, II and on sidewalls of the less-filled trenches t1, t2, thus gate patterns 218, 220 are each formed on the first and second active regions. The gate patterns 218, 220 are adapted to use, not only an upper part of each active region but also sidewalls of the less-filled trenches t1, t2, as a channel region, therefore an area of the channel region increases and a cell current increases.

The gate pattern is not limited to the designed scheme described in the exemplary embodiment of the present invention, but can be designed variously.

In the meantime, a nitride layer masking method as an example can be applied in conjunction with the present invention, instead of the general photolithograph process described above in the inventive exemplary embodiment.

Though not shown in the drawings, the device isolation layer 210 is formed so that an uppermost part thereof is positioned below an upper surface of the first and second active regions I, II, and thereon, a nitride layer is deposited entirely. Subsequently, the nitride layer is selectively etched so as to expose the second active region II and a portion of the device isolation layer 210, to thus selectively leave the nitride layer only the first active region I. Then, the remaining nitride layer is used as a mask, to form the first thermal oxide layer 214 of about 400 through 450 Å for use of high voltage on an exposed surface of the second active region II, and next, the remaining nitride layer is removed and the second thermal oxide layer 216 of 30 through 50 Å for use of low voltage is formed on the first active region. Thereby, the process of forming the dual gate oxide layer is completed, so that the uppermost part of the device isolation layer is positioned below the upper surface of the active region.

As was described above, according to an exemplary embodiment of the present invention, a trench interface of STI is utilized as an active region to increase an area of the active region with an effect of increasing a cell current.

Further, defects caused by an irregular thickness between the pad oxide layer and the thermal oxide layer of high voltage region can be reduced, or eliminated, and a stringer caused by a stepped coverage between the active region and the field region can be prevented.

In addition, it can be prevented a dent caused on a boundary face between the active region and the field region owing to a wet etching rate difference between materials of the field oxide layer formed on the STI and of the thermal oxide layer formed on the active region.

Of course, the invention can be practiced in a number of ways, and the particular embodiments described above and below are only examples, and are not limited to their details.

According to further exemplary embodiments of the present invention, in a method of manufacturing a dual gate insulation layer of a semiconductor device which has first and second active regions operating at mutually different voltages on a semiconductor substrate, the first and second active regions having a device isolation layer of STI (Shallow Trench Isolation) structure; the method includes forming the device isolation layer so that an uppermost part of the device isolation layer is positioned lower than an upper surface of the first and second active regions, before forming a gate insulation layer corresponding to each of the first and second active regions.

To achieve the invention and according to an exemplary embodiment of the present invention, in a dual gate oxide structure of a semiconductor device which has first and second active regions operating at mutually different voltages on a semiconductor substrate, the first and second active regions having a device isolation layer of STI structure; the structure includes a device isolation layer whose uppermost part is formed lower than an upper surface of the first and second active regions.

Herewith, an area of the active region increases to increase a cell current, thus a characteristic of the device is enhanced, and a stringer caused by a stepped coverage between the active region and a field region is prevented, and a dent caused on a boundary face between the active region and the field region is prevented.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A method of forming a dual gate oxide layer, comprising:
    sequentially forming a first insulation layer and a second insulation layer on a semiconductor substrate;
    sequentially etching the second insulation layer, the first insulation layer and a portion of the semiconductor substrate to form a trench for defining first and second active regions on the semiconductor substrate;
    filling the trench with a device isolation layer;
    planarizing the device isolation layer and the second insulation layer so that the second insulation layer formed on the first insulation layer remains by a determined thickness;
    removing the remaining second insulation layer;
    etching the first insulation layer and the device isolation layer such that an uppermost part of the device isolation layer is positioned below an upper surface of the semiconductor substrate that includes the first and second active regions;
    forming a first thermal oxide layer for use as a gate oxide layer on an upper surface of the first and second active regions and in a sidewall of a non-filled trench;
    removing the first thermal oxide layer provided with the first active region; and
    forming a second thermal oxide layer for use as a gate oxide layer on an upper surface of the first active region and a non-filled trench sidewall of the first active region, the second thermal oxide layer having a thickness thinner than the first thermal oxide layer.

2. The method as claimed in 1, further comprising, forming a gate pattern that uses the non-filled trench sidewall of the first and second active regions as a channel region.

3. The method as claimed in 1, wherein on the second insulation layer, an oxide layer of MTO (Medium Temperature Oxide) material is further formed, and the oxide layer of MTO material is etched together with the second insulation layer, the first insulation layer and the semiconductor substrate.

4. The method as claimed in 1, wherein the second insulation layer is formed of silicon nitride material or silicon oxide nitride material, which has a difference of a polishing selection rate from the device isolation layer.

5. The method as claimed in 1, wherein the device isolation layer is formed of any one selected from an oxide layer group that is composed of SOG (Spin On Glass), USG (Undoped Silicate Glass), BPSG (Boron Phosphorus Silicate Glass), PSG (Phosphor Silicate Glass), PE-TEOS (Plasma Enhanced Tetra Ethyl Ortho Silicate) and flowable oxide material, or is formed of a multilayer containing two or more selected from the oxide layer group.

6. The method as claimed in 1, wherein the device isolation layer is formed by using any one selected among a chemical vapor deposition (CVD), a reflow system and a deposition using a high density plasma (HDP) equipment.

7. The method as claimed in 1, wherein the first active region is a low voltage region and the second active region is a high voltage region.

8. The method as claimed in 7, wherein the high voltage region is designed to have an internal operating voltage of approximately 3.3V through 50V.

9. The method as claimed in 1, wherein an uppermost part of the device isolation layer is positioned below by about 200 Å through 300 Å from an upper surface of the first and second active regions.

* * * * *

UNITED STATES PATENT AND TRADEMARK OFFICE
CERTIFICATE OF CORRECTION

PATENT NO. : 7,250,346 B2 Page 1 of 1
APPLICATION NO. : 10/876277
DATED : July 31, 2007
INVENTOR(S) : Jong-Sik Chun et al.

It is certified that error appears in the above-identified patent and that said Letters Patent is hereby corrected as shown below:

Column 5, line 62, the words "1,11," should read -- I, II, --.

Signed and Sealed this

Second Day of September, 2008

JON W. DUDAS
*Director of the United States Patent and Trademark Office*